United States Patent [19]
Iwata

[11] Patent Number: 5,519,722
[45] Date of Patent: May 21, 1996

[54] II-VI COMPOUND SEMICONDUCTOR LASER WITH BURYING LAYERS

[75] Inventor: Hiroshi Iwata, Tokyo, Japan

[73] Assignee: NEC Corporation, Japan

[21] Appl. No.: 365,423

[22] Filed: Dec. 28, 1994

[30] Foreign Application Priority Data

Dec. 28, 1993 [JP] Japan .................................. 5-334305

[51] Int. Cl.⁶ ..................................................... H01S 3/19
[52] U.S. Cl. ................................................ 372/46; 372/45
[58] Field of Search ........................................ 372/46, 45

[56] References Cited

U.S. PATENT DOCUMENTS 5,404,027   4/1995   Haase et al. ............................. 372/45

FOREIGN PATENT DOCUMENTS 4-115588   4/1992   Japan ..................................... 372/46

OTHER PUBLICATIONS

Applied Physics Letters, vol. 63, No. 17, pp. 2315–2317, Oct. 1993.

*Primary Examiner*—Rodney B. Bovernick
*Assistant Examiner*—Yisun Song

[57] ABSTRACT

A II-VI compound semiconductor laser in which even if a II-VI compound semiconductor material having a large energy band gap is used for a burying layer, electrons can be confined effectively. The laser contains an n-side region in which the majority carrier is an electron, a first burying layer and a second burying layer. The first burying layer is formed to be contacted with the n-side region, and the second burying layer is formed on the first burying layer to cover the first burying layer. The first burying layer has a bottom of a conduction band that is equal to or higher than that of the n-side region, so that the first burying layer has a function of confining electrons in the n-side region. The first and second burying layers have first and second refractive indices, respectively. The first one is larger than the second one. The n-side region has a third refractive index. The first refractive index is larger than the second and third refractive indices, the second refractive index is smaller than the third refractive index, so that the second burying layer confines light in the n-side region.

11 Claims, 3 Drawing Sheets

II-VI COMPOUND SEMICONDUCTOR LASER WITH BURYING LAYERS

BACKGROUND OF THE INVENTION

1. Field of the Invention

The present invention relates to a semiconductor laser and more particularly, to a II-VI semiconductor laser with burying layers for burying the heterostructure.

2. Description of the Prior Art

A conventional II-VI compound semiconductor laser of this sort is disclosed in Applied Physics Letters, Vol. 63, No. 17, pp2315–2317, October, 1993. This laser has a buried-ridge structure containing a CaAs substrate, MgZnSSe cladding layers, ZnSSe guiding layers, and a single strained, pseudomorohic CdZnSe quantum well, and a polycrystalline ZnS burying layers. The MqZnSSe upper cladding layer is selectively etched to form a ridge, and the ridge is buried by the ZnS burying layer.

However, in general, the heterostructure of the II-VI compound semiconductor materials has an energy band lineup termed the "type 2" or "staggered type". With the heterostructure of this type, which is made of first and second semiconductor layers, the first semiconductor layer has the bottom of the conduction band higher than that of the second semiconductor layer and the top of the valence band higher than that of the second semiconductor layer. Also, as the energy band gap increases, both of the bottom of the conduction band and the top of the valence band tend to come down.

As a result, if a semiconductor material having a large energy band gap is used for the burying layer, there is a problem that such the burying layer cannot confine electrons.

SUMMARY OF THE INVENTION

Accordingly, an object of the present invention is to provide a II-VI compound semiconductor laser in which even if a II-VI compound semiconductor material having a large energy band gap is used for a burying layer, electrons can be confined effectively.

Another object of the present invention is to provide a II-VI compound semiconductor laser in which even if a II-VI compound semiconductor material having a large energy band gap is used for a burying layer, satisfactorily optical confinement can be produced.

A II-VI compound semiconductor laser according to the present invention contains an n-type II-VI compound semiconductor region in which the majority carrier is an electron, a first II-VI compound semiconductor burying layer and a second II-VI compound semiconductor burying layer. The first burying layer is formed to be contacted with the n-side region, and the second burying layer is formed on the first burying layer to cover the first burying layer.

The first burying layer has a bottom of a conduction band that is equal to or higher than that of the n-side region, so that the first burying layer has a function of confining electrons in the n-side region.

The first and second burying layers have first and second refractive indices, respectively. The first refractive index is larger than the second refractive index. The n-side region has a third refractive index.

The first refractive index is larger than the second and third refractive indices, respectively. The second refractive index is smaller than the third refractive index, so that the second burying layer confines light in the n-side region.

The first burying layer has a thickness ranging from 1 nm to 100 nm. If the thickness is smaller than 1 nm, electrons pass through the first burying layer due to the tunnel effect. If it is larger than 100 nm, satisfactorily optical confinement cannot be obtained because of small difference between the thickness and the radiation or light wavelength of this laser.

In the case of the n-side region made of a plurality of II-VI compound semiconductor sublayers, the first burying layer needs to have a bottom of the conduction band (a) that is higher than all of those of the sublayers, or (b) that is equal to at least one of those of the sublayers and is larger than the remainder thereof.

Additionally, in this case, the third refractive index means an average of refractive indices of the plurality of sublayers.

In general, the heterostructure of the II-VI compound semiconductor materials has an energy band lineup termed the "type 2" or "staggered type", so that the bottom of the conduction band tends to come down and the refractive index tends to decrease as the energy band gap increases.

With the semiconductor laser of the invention, the first burying layer has the bottom of the conduction band higher than or equal to that of the n-side region whose majority carrier is an electron, so that the first burying layer can confine injected electrons in the n-side region effectively.

To confine the electrons in the n-side region, the first burying layer needs to have a thickness approximately equal to the diffusion length of an electron. From this view point, it is sufficient for the first burying layer to have a thickness ranging from 1 nm to 100 nm.

Because the thickness (1 nm to 100 nm) of the first burying layer is sufficiently small for the radiation wavelength (typically, 500 nm to 1000 nm) of this laser, the first burying layer will not be an obstacle to the optical confinement.

Further, since the first refractive index of the first burying layer is larger then the second refractive index of the second burying layer, the first burying layer does not provide optical continement in the n-side region. However, because the first refractive index is larger than the third refractive index of the n-side region, such the optical continement can be provided by the second burying layer.

DETAILED DESCRIPTION OF THE PREFERRED EMBODIMENTS

Figure 1:
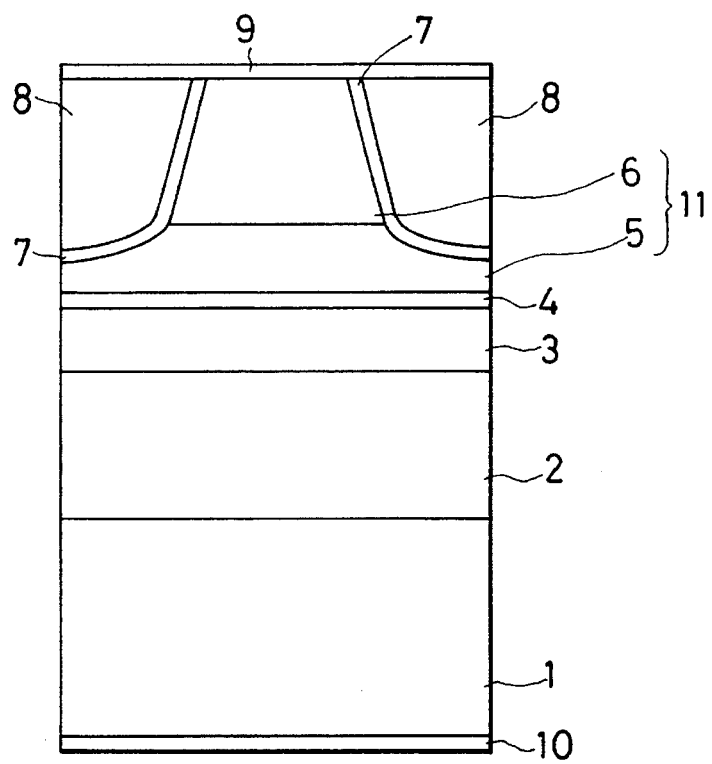
FIG. 1 is a schematic cross-section of a II-VI compound semiconductor laser according to a first embodiment of the invention.

Preferred embodiments of the present invention will be described bellow while referring to the drawings attached.

FIRST EMBODIMENT

Figure 2:
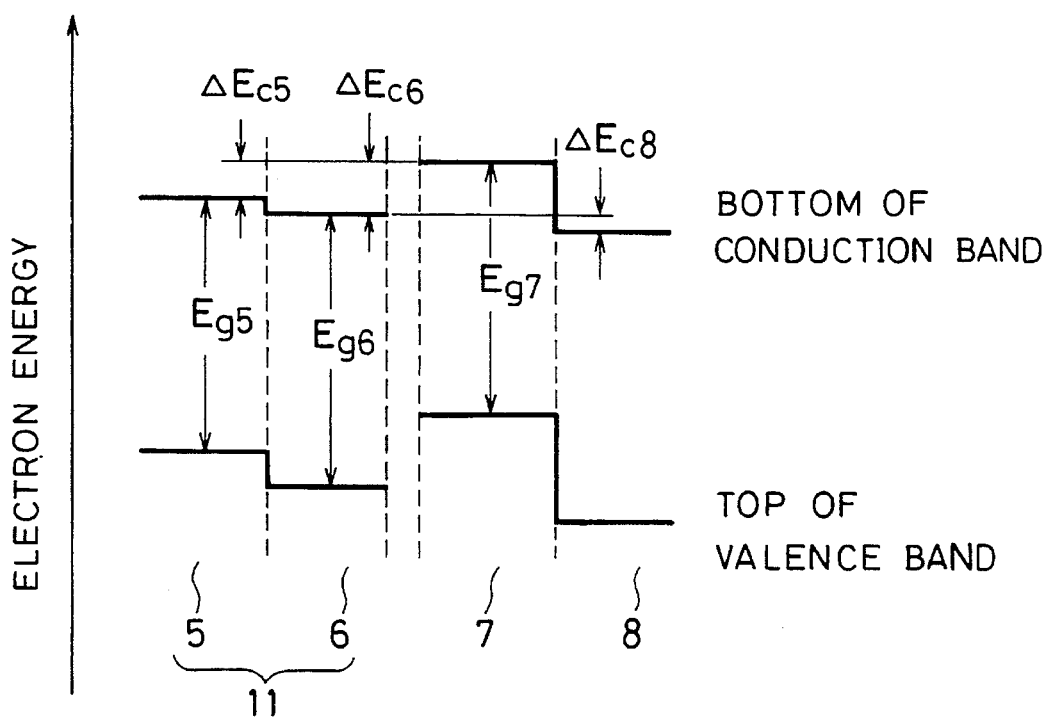
FIG. 2 is a partial energy band diagram of the semiconductor laser according to the first embodiment.
Figure 3:
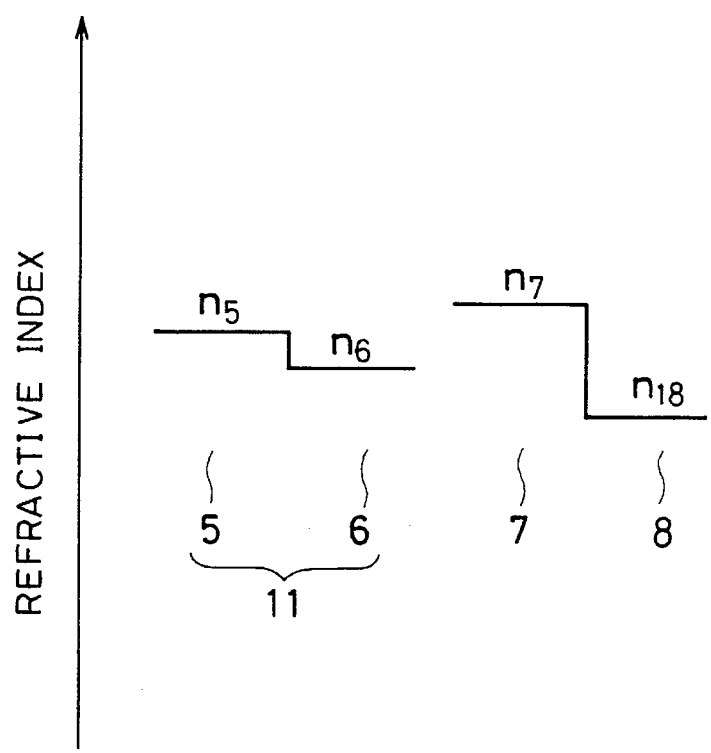
FIG. 3 shows a partial refractive index distribution of the semiconductor laser according to the first embodiment.

FIGS. 1 to 3 show a II-VI compound semiconductor laser according to a first embodiment, which is of a buried-heterostructure type.

As shown in FIG. 1, a p-type cladding layer 2 with a thickness of 1.5 µm, which is made of $Zn_{0.7}Cd_{0.3}S_{0.55}Se_{0.45}$ doped with nitrogen (N), is formed on a first main surface of a p-type GaAs substrate 1 of a rectangular shape. The layer 2 has a dopant concentration of $8\times10^{17}$ atoms/cm$^3$.

On the cladding layer 2, an i-type optically guiding layer 3 with a thickness of 100 nm, which is made of undoped $Zn_{0.8}Cd_{0.2}S_{0.38}Se_{0.62}$, is formed.

An i-type active layer 4 with a thickness of 10 nm, which is made of undoped $Zn_{0.8}Cd_{0.2}Se$ with a strained quantum well (QW) structure, is formed on the guiding layer 3.

An i-type optically guiding layer 5 with a thickness of 100 nm, which is made of undoped $Zn_{0.8}Cd_{0.2}S_{0.38}Se_{0.62}$, is formed on the QW active layer 4.

On the guiding layer 5, an n-type cladding layer 6 with a thickness of 1.5 µm, which is made of $Zn_{0.7}Cd_{0.3}S_{0.55}Se_{0.45}$ doped with chlorine (Cl), is formed. The layer 6 has a dopant concentration of $1\times10^{18}$ atoms/cm$^3$.

The guiding layer 5 and the cladding layer 6 form a ridge of a 5 µm width. The ridge runs along the lengthwise center line of the substrate 1. The layer 5 has a pair of exposed top faces at each side of the ridge. The layer 6 has a pair of exposed side faces at each side of the ridge.

An i-type first burying layer 7 with a thickness of 50 nm, which is made of undoped $Zn_{0.9}Cd_{0.1}S_{0.22}Se_{0.78}$, is formed at each side of the ridge to cover the pair of exposed top faces of the guiding layer 5 and the pair of exposed side faces of the cladding layer 6.

On the first burying layer 7, an i-type second burying layer 8, which is made of undoped $Zn_{0.6}Cd_{0.4}S_{0.71}Se_{0.29}$, is selectively formed on the first burying layer 7 at each side of the ridge. The layer 8 is formed to bury the underlying second guiding layer 5 and the neighboring second cladding layer 6.

An n-side electrode 9 made of gold (Au) is formed on the top face of the ridge. The n-side electrode 9 covers the exposed top face of the n-type cladding layer 6, the exposed top ends of the first burying layer 7, and the exposed top faces of the second burying layer 8.

A p-side electrode 10 made of Au is formed on the second main surface of the substrate 1. The p-side electrode 10 covers the entire second main surface.

All of the above layers except for the active layer 4 are lattice-matched with the substrate 1.

The semiconductor laser of the first embodiment is fabricated by the following process sequence:

First, on the first main surface of the p-type GaAs substrate 1, the p-type cladding layer 2, the i-type optically guiding layer 3, the i-type active layer 4, the i-type optically guiding layer 5, and the n-type cladding layer 6 are successively formed to be stacked by molecular beam epitaxy (MBE).

Next, the cladding layer 6 is selectively removed at its both sides by dry etching, remaining the ridge running along the lengthwise center line of the substrate 1, as shown in FIG. 1. During this etching process, the surface of the i-type guiding layer 5 is partially etched so that the pair of exposed top faces are produced at each side thereof.

Subsequently, the i-type burying layer 7 is formed at each side of the ridge to cover the pair of exposed top faces of the guiding layer 5 and the pair of exposed side faces of the cladding layer 6 by MBE.

Then, the i-type burying layer 8 is selectively formed on the burying layer 7 to bury the underlying second guiding layer 5 and the neighboring cladding layer 6 by MBE.

Finally, Au is deposited to cover the exposed top face of the n-type cladding layer 6, the exposed top ends of the first burying layer 7, and the exposed top faces of the second burying layer 8 by vacuum evaporation, forming the n-side electrode 9. At the same time, Au is deposited on the second main surface of the substrate 1, forming the p-side electrode 10 thereon.

In the first embodiment, the i-type guiding layer 5 and the n-type cladding layer having electrons as the majority carrier constitute an n-side region 11. The first burying layer 7 is formed to be contacted with the both layers 5 and 6. The second burying layer 8 is formed on the first burying layer 7 to bury the ridge therebetween.

FIG. 2 partially shows an energy band lineup of this laser. As shown in FIG. 2, the first burying layer 7 has the bottom of the conduction band higher than that of the second cladding layer 6 and the top of the valence band higher than that of the cladding layer 6. Also, the burying layer 7 has the bottom of the conduction band higher than that of the second guiding layer 5 and the top of the valence band higher than that of the guiding layer 5. This means that the energy band lineup of this laser is of the type 2 or the staggered type.

In addition, FIG. 3 partially shows a refractive index distribution of this laser. As shown in FIG. 3, the guiding layer 5 has a refractive index $n_5$ of 2.62, the cladding layer 6 has a refractive index $n_6$ of 2.59, the first burying layer 7 has a refractive index $n_7$ of 2.64, and the second burying layer 8 has a refractive index $n_8$ of 2.55.

Therefore, the refractive index $n_8$ of the second burying layer 8 is smaller than the refractive index $n_6$ of the cladding layer 6 by about 2%. Also, the index $n_8$ of the second burying layer 8 is smaller than the average of the refractive indices $n_5$ and $n_6$ of the guiding and cladding layers 5 and 6, i.e., the n-side region 11.

Next, the operation of this laser is shown below.

When electrons are injected into the n-type cladding layer 6 through the n-side electrode 9, the electrons flow through the n-type cladding layer 6 and the i-type guiding layer 5, and then they recombine with holes in the i-type QW active layer 4, radiating laser light from the active layer 4.

The first burying layer 7 has an energy band gap $E_{g7}$ less than energy band gaps $E_{g5}$ and $E_{g6}$ of the guiding layer 5 and the cladding layer 6, respectively, as shown in FIG. 2. However, the layer 7 has the bottom of the conduction band higher than that of the layer 6 by 170 meV, i.e., an energy band discontinuity $\Delta E_{c6}$ therebetween is 170 meV. Also, the layer 7 has the bottom of the conduction band higher than that of the layer 5 by 80 meV, i.e., an energy band discontinuity $\Delta E_{c5}$ therebetween is 80 meV.

Accordingly, the first burying layer 7 can confine effectively the injected electrons within the n-type guiding layer 5 and the n-type cladding layer 6, i.e., within the n-side region.

Although the thickness of the first burying layer 7 is 50 nm, which is very thin compared with the radiation wavelength (typically, 500 nm to 1000 nm) of this laser, the injected electrons can be restrained from diffusing drastically.

The first and second burying layers 7 and 8 are very high in electric resistance, so that there is no possibility that the electrons flow into these layers 7 and 8.

As stated above, the injected electrons can be confined by the first burying layer 7 due to the energy band discontinuity in the bottom of the conduction band. However, light cannot be confined by the layer 7, because the layer 7 is larger in refractive index than both of the layers 5 and 6. In the first embodiment, the optical confinement is carried out by the second burying layer 8 in the following ways:

The second burying layer 8 has the bottom of the conduction band lower than that of the n-type cladding layer 6 by 90 meV, in other words, the layer 8 has the energy band discontinuity $\Delta E_{c8}$ of 90 meV compared with the layer 6. Therefore, the layer 8 scarcely contributes to the above electron confinement. However, the layer 8 is smaller in refractive index than the layer 6 by about 2% and at the same time, the layer 8 is smaller in refractive index than the n-side region 11. As a result, the layer 8 can confine the light within the layers 5 and 6, or the n-side region 11 effectively.

A semiconductor laser according to the first embodiment was fabricated practically and tested by the inventor. As a result, the laser operated at a low threshold current of 15 mA and radiated blue-green light.

In the first embodiment, a ZnCdSSe mixed crystal is used; however, any other II-VI compound semiconductor material such as ZnCdSeTe one may be used.

SECOND EMBODIMENT

Figure 6:
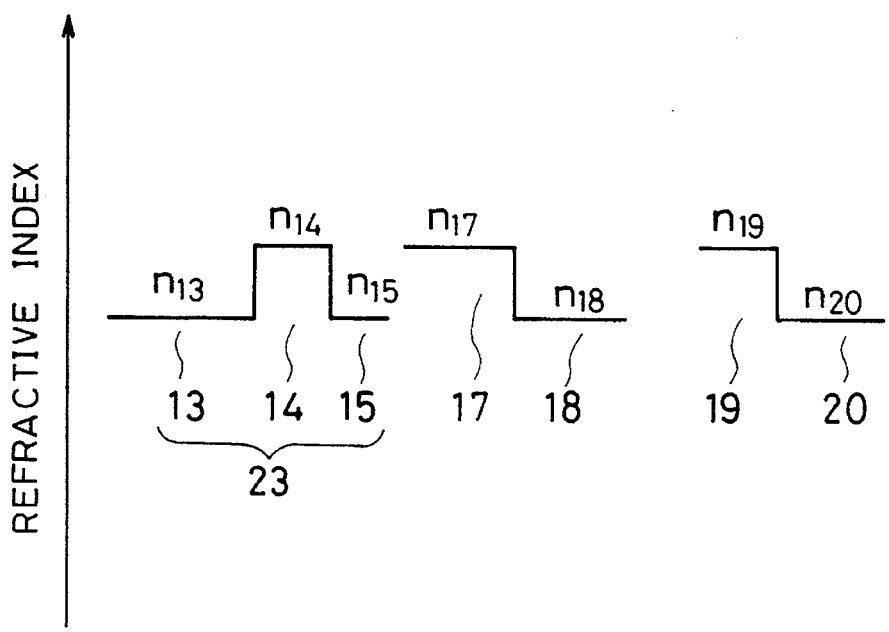
FIG. 6 shows a refractive index distribution of the semiconductor laser according to the second embodiment.
Figure 4:
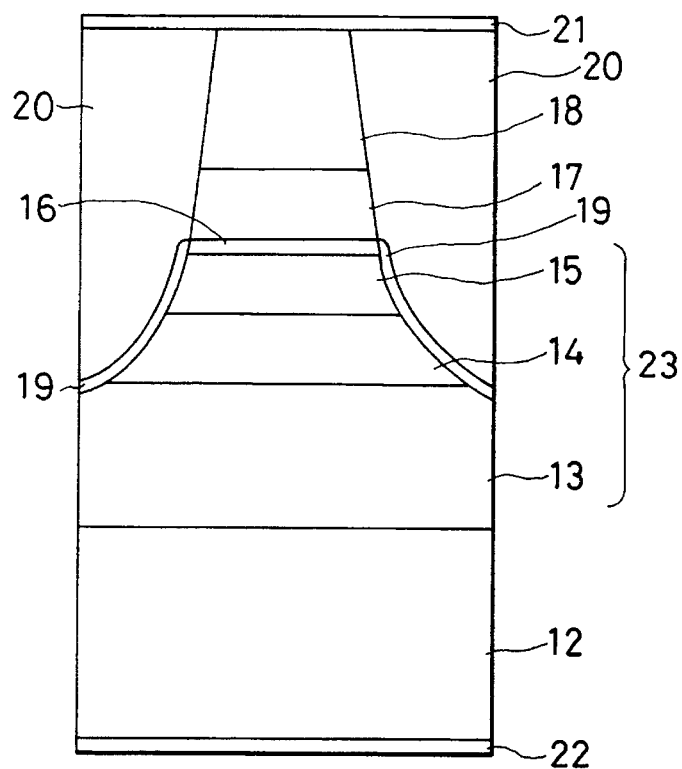
FIG. 4 is a schematic cross-section of a II-VI compound semiconductor laser according to a second embodiment of the invention.
Figure 5:
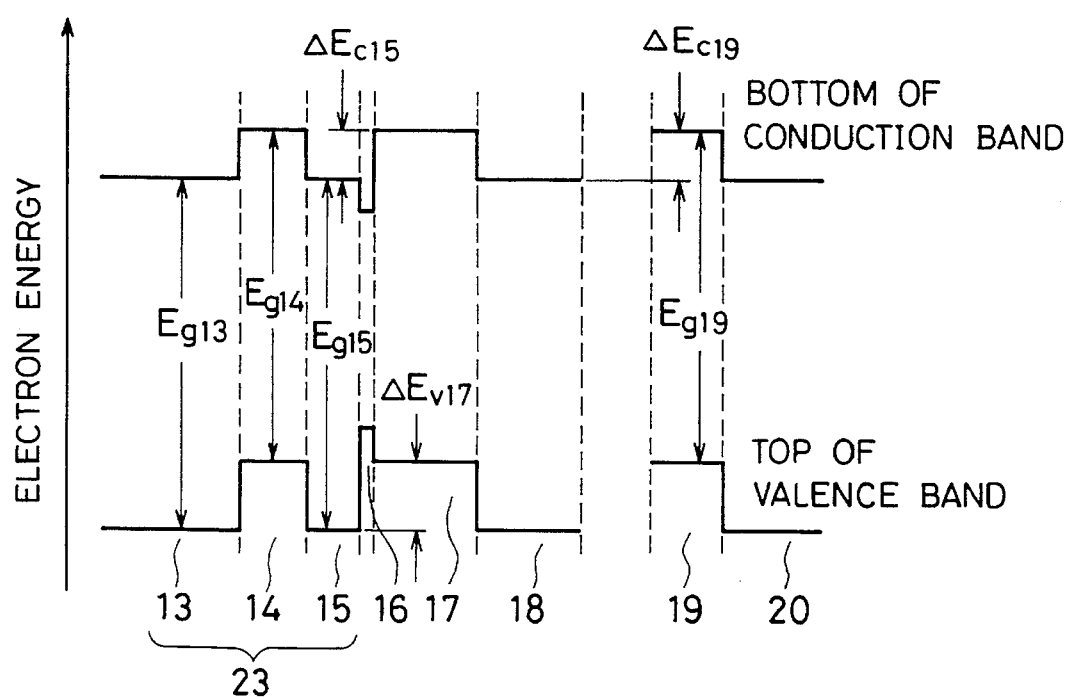
FIG. 5 is an energy band diagram of the semiconductor laser according to the second embodiment.

FIGS. 4 to 6 show a II-VI compound semiconductor laser according to a second embodiment, which is also of a buried-heterostructure type.

As shown in FIG. 4, an n-type first cladding layer 13 with a thickness of 1.5 μm, which is made of $Zn_{0.7}Cd_{0.3}S_{0.55}Se_{0.45}$ doped with choline (Cl), is formed on a first main surface of an n-type GaAs substrate 12 of a rectangular shape. The layer 13 has a dopant concentration of $1\times10^{18}$ atoms/cm$^3$.

On the first cladding layer 13, an n-type electron barrier layer 14 with a thickness of 70 nm, which is made of $Zn_{0.9}Cd_{0.1}S_{0.22}Se_{0.78}$ doped with Cl, is formed. The layer 14 has a dopant concentration of $5\times10^{17}$ atoms/cm$^3$.

An n-type electron confining layer 15 with a thickness of 30 nm, which is made of $Zn_{0.7}Cd_{0.3}S_{0.55}Se_{0.45}$ doped with Cl, is formed. The layer 15 has a dopant concentration of $1\times10^{17}$ atoms/cm$^3$.

An i-type active layer 16 with a thickness of 10 nm, which is made of undoped $Zn_{0.7}Cd_{0.3}Se$ with a strained QW structure, is formed on the n-type electron confining layer 15.

A p-type hole confining layer 17 with a thickness of 100 nm, which is made of $Zn_{0.9}Cd_{0.1}S_{0.22}Se_{0.78}$ doped with N, is formed on the QW active layer 16. The layer 17 has a dopant concentration of $1\times10^{17}$ atoms/cm$^3$.

On the p-type hole confining layer 17, a p-type cladding layer 18 with a thickness of 1.5 μm, which is made of $Zn_{0.7}Cd_{0.3}S_{0.55}Se_{0.45}$ doped with N, is formed. The layer 18 has a dopant concentration of $1\times10^{18}$ atoms/cm$^3$.

The n-type electron barrier layer 14, the n-type electron confining layer 15, the i-type active layer 16, the p-type hole confining layer 17 and the p-type second cladding layer 18 form a ridge of a 5 μm width. The ridge runs along the lengthwise center line of the substrate 12. Each of these layers 14, 15, 16, 17 and 18 has a pair of exposed side faces at each side of the ridge.

An i-type first burying layer 19 with a thickness of 50 nm, which is made of undoped $Zn_{0.9}Cd_{0.1}S_{0.22}Se_{0.78}$, is formed at each side of the ridge to cover the pairs of exposed side faces of the electron barrier layer 14, the electron confining layer 15 and the QW active layer 16.

On the first burying layer 19, an i-type second burying layer 20, which is amde of undoped $Zn_{0.7}Cd_{0.3}S_{0.55}Se_{0.45}$, is selectively formed on the first burying layer 19 at each side of the ridge. The second burying layer 20 is formed to bury the underlying first burying layer 19 and the neighboring layers of the hole confining layer 17 and the cladding layer 18.

A p-side electrode 21 made of gold (Au) is formed on the top face of the ridge. The p-side electrode 21 covers the exposed top face of the n-type cladding layer 18 and the pair of exposed top faces of the second burying layer 20.

An n-side electrode 22 made of Au is formed on the second main surface of the substrate 12. The n-side electrode 22 covers the entire second main surface.

All of the above layers except for the active layer 16 are lattice-matched with the substrate 12.

The semiconductor laser of the second embodiment is fabricated by the following process sequence:

First, on the first main surface of the n-type GaAS substrate 12, the n-type first cladding layer 13, the n-type electron barrier layer 14, the n-type electron confining layer 15, the i-type active layer 16, the p-type hole confining layer 17 and the p-type second cladding layer 18 are successively formed to be stacked by MBE.

Next, as shown in FIG. 4, the stacked layers 14, 15, 16, 17 and 18 are selectively removed at its both sides by dry etching, remaining the ridge running along the lengthwise center line of the substrate 12. During this etching process, the surface of the n-type cladding layer 13 is partially etched so that the pair of exposed top faces are produced at each side thereof.

Subsequently, the i-type first burying layer 19 is formed at each side of the ridge to cover the pair of exposed top faces of the layer 13 and the pairs of exposed side faces of the layers 14, 15 and 16 by MBE.

Then, the i-type second burying layer 20 is selectively formed on the first burying layer 19 at each side of the ridge to bury the neighboring hole confining layer 17 and the second cladding layer 18 by MBE.

Finally, Au is deposited to cover the exposed top face of the p-type second cladding layer 18 and the exposed top faces of the second burying layer 20 by vacuum evaporation, forming the p-side electrode 21. At the same time, Au is deposited on the second main surface of the substrate 12, forming the n-side electrode 22 thereon.

In the second embodiment, the n-type cladding layer 13, the n-type electron barrier layer 14 and the n-type electron confining layer 15, each of which has electrons as the majority carrier, constitute an "n-side region" 23. The first burying layer 19 is formed to be contacted with the n-side region 23. The second burying layer 20 is formed on the first burying layer 19 to be contacted with the overlying layers 17 and 18 at each side of the ridge, burying the ridge therebetween.

FIG. 5 shows an energy band lineup of this laser. As shown in FIG. 5, the first burying layer 19 has the bottom of the conduction band higher than those of the first cladding layer 13 and the electron confining layer 15, and the top of the valence band higher than those of the layers 13 and 15. Also, the burying layer 19 has the bottom of the conduction band equal to that of the electron barrier layer 14 and the top of the valence band equal to that of the layer 14. This means that the energy band lineup of this laser is of the type 2 or the staggered type.

In addition, FIG. 6 shows a refractive index distribution of this laser. As shown in FIG. 6, the n-type cladding layer 13, the n-type electron confining layer 15, the p-type cladding layer 18 and the second burying layer 20 have refractive indices $n_{13}$, $n_{15}$, $n_{18}$ and $n_{20}$, respectively, all of the indices being 2.59. The n-type electron barrier layer 14, the p-type hole confining layer 17 and the first burying layer 19 have refractive indices $n_{14}$, $n_{17}$ and $n_{19}$, respectively, all of the indices being 2.64.

Therefore, the refractive index $n_{20}$ of the second burying layer 20 is smaller than the refractive index $n_{20}$ of the electron barrier layer 14. Also, the index $n_{20}$ of the layer 20 is equal to the refractive indices $n_{13}$ and $n_{15}$ of the n-type cladding layer 13 and the n-type electron confining layer 15.

As a result, the index $n_{20}$ of the second burying layer 20 is smaller than the average of the indices $n_{13}$ $n_{14}$ and $n_{15}$ of the layers 13, 14 and 15, i.e., the refractive index of the n-side region 23.

Next, the operation of the laser of the second embodiment is shown below.

When electrons are injected into the n-type substrate 12 through the n-side electrode 22, the electrons thus injected flow through the n-side region 23, i.e., the n-type cladding layer 13, the n-type electron barrier layer 14 and the n-type electron confining layer 15 into the i-type QW active layer 16, and then they recombine with holes within the active layer 16, radiating laser light from the active layer 16.

The first burying layer 19 has, as shown in FIG. 2, an energy band gap $E_{g19}$ that is less than energy band gaps $E_{g13}$ and $E_{g15}$ of the cladding layer 13 and the electron confining layer 15. The band gap $E_{g19}$ is equal to an energy band gap $E_{g14}$ of the electron confining layer 14. However, in the bottom of the conduction band, the layer 19 has an energy band discontinuity $\Delta E_{c19}$ of 170 mev. Accordingly, the first burying layer 19 can confine the flowing electrons within the contacting layers 13, 14 and 15 effectively.

As a result, although the thickness of the first burying layer 19 is 50 nm, which is very thin, the flowing electrons can be restrained from diffusing drastically.

The second burying layer 20 is very high in electric resistance, so that there is no possibility that holes do not flow into the layer 20 through the p-side electrode 21.

As stated above, the electrons can be confined by the first burying layer 19 due to the energy band discontinuity in the bottom of the conduction band. However, light cannot be confined by the layer 19, because the layer 19 is larger in refractive index than or equal to the three layers 13, 14 and 15 forming the n-side region 23. In the second embodiment, the optical confinement is carried out by the second burying layer 20 in the following way:

Since the second burying layer 20 has the bottom of the conduction band lower than that of the electron barrier layer 14, the layer 20 scarcely contributes to the above electron confinement. However, the layer 20 is equal in refractive index to the n-type first cladding layer 13 and at the same time, the layer 20 is smaller in refractive index than the n-side region 23. As a result, the layer 20 can confine the light within the layers 14 and 15 effectively.

A semiconductor laser according to the second embodiment was fabricated and tested by the inventor. As a result, the laser operated at a lower threshold current of 10 mA than that of the first embodiment, and radiated blue-green light.

In the first and second embodiments, a ZnCdSSe-system mixed crystal is used; however, any other II-VI compound semiconductor material such as ZnCdSeTe-system one may be used.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. In a II-VI compound semiconductor laser, said laser comprising:

an n-type II-VI compound semiconductor region in which the majority carrier is an electron;

a first II-VI compound semiconductor burying layer, said first burying layer being formed to be contacted with said n-side region;

a second II-VI compound semiconductor burying layer, said second burying layer being formed on said first burying layer to cover said first burying layer;

said first burying layer having a bottom of a conduction band that is equal to or higher than that of said n-side region, so that said first burying layer has a function of confining electrons in said n-side region;

said first and second burying layers having first and second refractive indices, respectively, said first refractive index being larger than the second refractive index;

said n-side region having a third refractive index;

said first refractive index being larger than said second and third refractive indices, respectively;

said second refractive index being smaller than said third refractive index, so that said second burying layer confines light in said n-side region; and said first burying layer having a thickness ranging from 1 nm to 100 nm.

2. The laser as claimed in claim 1, wherein said n-side region is made of a plurality of II-VI compound semiconductor sublayers, and said first burying layer has a bottom of the conduction band that is higher than all of those of said sublayers.

3. The laser as claimed in claim 1, wherein said n-side region is made of a plurality of II-VI compound semiconductor sublayers, and said first burying layer has a bottom of the conduction band that is equal to at least one of those of said sublayers and is larger than the remainder thereof.

4. The laser as claimed in claim 1, wherein said II-VI compound semiconductor is a ZnCdSSe system.

5. The laser as claimed in claim 1, wherein said n-side region has a ridge structure, and said first burying layer is formed on said ridge structure at each side of said ridge;

and wherein said second burying layer is formed on said first burying layer at each side of said ridge to bury said ridge therebetween.

6. A II-VI compound semiconductor laser comprising:

a p-type semiconductor substrate;

a p-type first cladding layer formed on a first main surface of said substrate;

a p-type first guiding layer formed on said first cladding layer;

an active layer formed on said first guiding layer;

an n-type second guiding layer formed on said active layer;

an n-type second cladding layer formed on said second guiding layer;

an n-side electrode formed on said second cladding layer;

a p-side electrode formed on a second main surface of said substrate;

said second guiding layer and said second cladding layer forming an n-side region whose majority carrier is an electron;

said n-side region forming a ridge extending along said substrate;

a first burying layer formed to be contacted with said n-side region, said first burying layer having a thickness ranging from 1 nm to 100 nm;

a second burying layer formed on said first burying layer to cover said first burying layer;

said first burying layer having a bottom of a conduction band that is equal to or higher than that of said n-side region, so that said first burying layer has a function of confining electrons in said n-side region;

said first and second burying layers having first and second refractive indices, respectively, said first refractive index being larger than the second refractive index;

said n-side region having a third refractive index;

said first refractive index being larger than said second and third refractive indices, respectively; and said second refractive index being smaller than said third refractive index, so that said second burying layer confines light in said n-side region.

7. The laser as claimed in claim 6, said first burying layer has a bottom of the conduction band that is higher than those of said second guiding layer and said second cladding layer.

8. The laser as claimed in claim 6, wherein said first cladding layer, said first guiding layer, said second guiding layer, said second cladding layer, said first burying layer and said second burying layer are made of ZnCdSSe semiconductor material.

9. A II-VI compound semiconductor laser comprising:

an n-type semiconductor substrate;

an n-type first cladding layer formed on a first main surface of said substrate;

an n-type electron barrier layer formed on said first cladding layer;

an n-type electron confining layer formed on said electron barrier layer;

an active layer formed on said electron confining layer;

a p-type hole confining layer formed on said active layer;

a p-type second cladding layer formed on said hole confining layer;

a p-side electrode formed on said second cladding layer;

an n-side electrode formed on a second main surface of said substrate;

said electron barrier layer and said electron confining layer forming an n-side region whose majority carrier is an electron;

said n-side region, said hole confining layer, said second cladding layer forming a ridge extending along said substrate;

a first burying layer formed to be contacted with said n-side region, said first burying layer having a thickness ranging from 1 nm to 100 nm;

a second burying layer formed on said first burying layer to cover said first burying layer;

said first burying layer having a bottom of a conduction band that is equal to or higher than that of said n-side region, so that said first burying layer has a function of confining electrons in said n-side region;

said first and second burying layers having first and second refractive indices, respectively, said first refractive index being larger than the second refractive index;

said n-side region having a third refractive index;

said first refractive index being larger than said second and third refractive indices, respectively; and said second refractive index being smaller than said third refractive index, so that said second burying layer confines light in said n-side region.

10. The laser as claimed in claim 9, wherein said first burying layer has a bottom of the conduction band that is equal to at least one of those of said first cladding layer, said electron barrier layer and said electron confining layer and is larger than the remainder thereof.

11. The laser as claimed in claim 9, said first cladding layer, said electron barrier layer, said electron confining layer, said hole confining layer, said second cladding layer, said first burying layer and said second burying layer are made of ZnCdSSe semiconductor material.

* * * * *